United States Patent
Chang et al.

(10) Patent No.: US 7,232,762 B2
(45) Date of Patent: Jun. 19, 2007

(54) METHOD FOR FORMING AN IMPROVED LOW POWER SRAM CONTACT

(75) Inventors: Chia-Der Chang, Hsinchu (TW); Yu-Ching Chang, Hsinchu (TW); Chien-Chih Chou, Jubei (TW); Yi-Tung Yen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/871,102

(22) Filed: Jun. 16, 2004

(65) Prior Publication Data

US 2005/0282395 A1 Dec. 22, 2005

(51) Int. Cl.
*H01L 21/311* (2006.01)

(52) U.S. Cl. ............... 438/694; 216/46; 216/67; 216/69; 216/70; 438/637; 438/638; 438/643; 438/646; 438/668; 438/696; 438/697; 438/708; 438/712; 438/714; 438/719; 438/720; 438/730

(58) Field of Classification Search .............. 216/69, 216/70; 438/637, 638
See application file for complete search history.

(56) References Cited

U.S. PATENT DOCUMENTS

| 6,372,638 | B1 * | 4/2002 | Rodriguez et al. ........... 438/640 |
| 6,410,424 | B1 * | 6/2002 | Tsai et al. ................... 438/637 |
| 6,613,683 | B2 * | 9/2003 | Hwangbo et al. ........... 438/706 |
| 6,635,576 | B1 * | 10/2003 | Liu et al. .................... 438/700 |

OTHER PUBLICATIONS

S.Wolf, Silicon Processing for the VLSI Era, vol. IV, Lattice Press, (2002), pp. 245, 249-251 and 502.*
S.Wolf, Silicon Processing for the VLSI Era, vol. I, Lattice Press (1986), pp. 554 and 555.*

* cited by examiner

*Primary Examiner*—Nadine Norton
*Assistant Examiner*—Maki Angadi
(74) *Attorney, Agent, or Firm*—Tung & Associates

(57) ABSTRACT

A method of forming contact openings in a semiconductor device including providing a semiconducting substrate; forming an etch stop layer on said semiconducting substrate; forming a dielectric layer on said etch stop layer; forming a bottom anti-reflective coating (BARC) on said dielectric layer; forming and patterning a mask on said BARC layer; and, forming at least a first contact opening exposing said etch stop layer by a first etching process.

27 Claims, 3 Drawing Sheets

METHOD FOR FORMING AN IMPROVED LOW POWER SRAM CONTACT

FIELD OF THE INVENTION

This invention generally relates to semiconductor processing methods for forming contacts in a multilevel semiconductor device and more particularly a method for forming an improved contact in a low power memory device.

BACKGROUND OF THE INVENTION

Etching of openings for forming electrical interconnects in the semiconductor processing industry is becoming more demanding as device sizes shrink. For example, as device sizes shrink to 0.15 microns and lower, the profiles of electrical contact holes can affect increasingly stringent electrical operating design requirements of integrated circuits.

There are a wide variety of variables that affect the anisotropicity of etching profiles in etching contact openings with an aspect ratio from about 3 to about 6. For example as the aspect ratio increases, the phenomenon of etch stop may occur where there is a build-up of fluoropolymers created during the plasma etching process along the sidewalls in the bottom of the etched opening which can degrade anisotropicity, effectively resulting in a cessation of anisotropic etching and the degradation of etching profiles. A degradation of etching profiles where the upper portion of the contact opening has a larger diameter may adversely affect both electrical resistance and capacitance of the integrated circuit.

While the formation of semiconductor devices of the prior art where device sizes have been relatively larger with a wider window for electrical property variations have had correspondingly greater room for variation in etching profiles and a greater tolerance for non-selective etching processes, increasingly stringent design requirements require an increasingly greater level of accuracy in forming electrical contacts.

For example, in ultra low power devices, for example a static random access memory device (SRAM), which require periodic refresh signals to retain stored data, the ratio of standby current (Isb) to drive current (Idr) is a critical design parameter in low power devices to enable proper functioning. For example, in creating an SRAM device it is frequently desirable to have an etch stop layer in an reactive ion etching (RIE) process to form contact openings since the relative depth of different contact openings in an etching process may vary, requiring an effective etch stop layer to prevent premature etch through.

One problem according to prior art RIE etching processes deals with the sufficient selectivity of etch stop layers. For example, forming contact openings including sufficient etch stop layer etching resistance to prevent premature etch-through, while maintaining sufficient etching selectivity in a subsequent etching process to avoid contact opening enlargement at an upper portion of the contact opening, is difficult to achieve according to the design requirements required, for example for 0.15 micron low power SRAM devices.

There is therefore a need in the semiconductor manufacturing art for an improved method to form sub-micron semiconductor devices including an anisotropic etching process such that anisotropically etched contact openings are formed with improved etching profiles to satisfy electrical design constraints.

It is therefore an object of the invention to provide an improved method to form sub-micron semiconductor devices including an anisotropic etching process such that anisotropically etched contact openings are formed with improved etching profiles to satisfy electrical design constraints as well as overcoming other shortcomings in the prior art.

SUMMARY OF THE INVENTION

To achieve the foregoing and other objects, and in accordance with the purposes of the present invention, as embodied and broadly described herein, the present invention provides a method of forming contact openings in a semiconductor device.

In a first embodiment, the method includes providing a semiconducting substrate; forming an etch stop layer on said semiconducting substrate; forming a dielectric layer on said etch stop layer; forming a bottom anti-reflective coating (BARC) on said dielectric layer; forming and patterning a mask on said BARC layer; and, forming at least a first contact opening exposing said etch stop layer by a first etching process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to and is particularly advantageously implemented in forming low power static random access memory (SRAM) devices, for example a 6 transistor type SRAM device having linewidths less than about 0.15 microns, it will be appreciated that the method of the present may be advantageously used to improve the etching profile of a contact opening in general, especially where an etch stop layer in conjunction with a bottom anti-reflectance coating (BARC) are advantageously used together to improve an etch stop effectiveness while preventing contact opening enlargement of an upper portion of a contact opening. The method of the present invention is especially advantageous when contact openings of varying depths are formed in parallel.

Figure 1A:
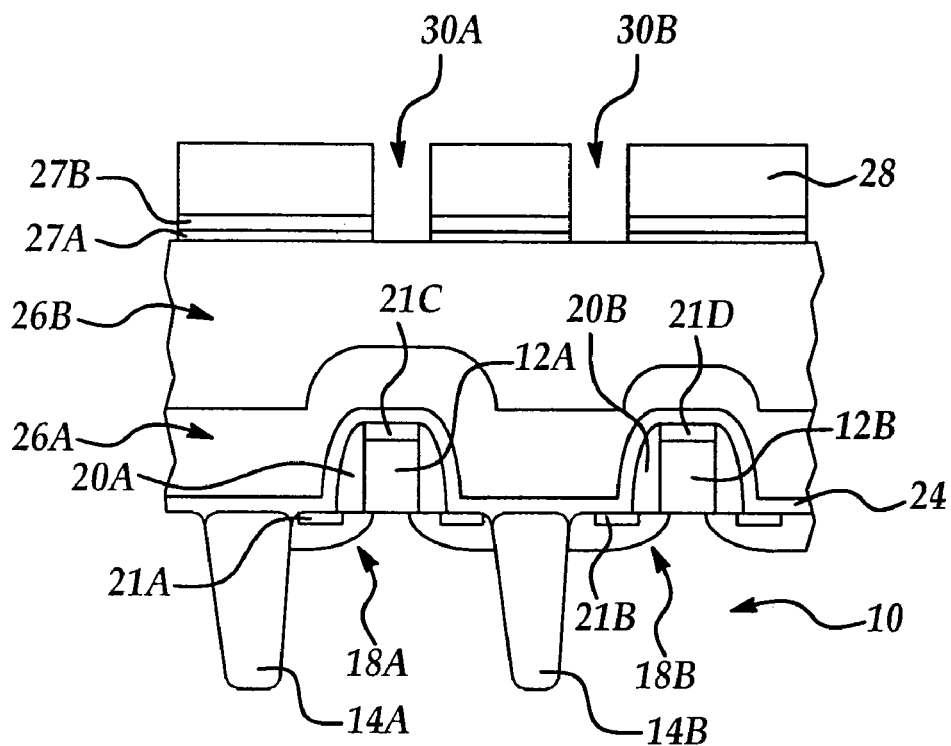
FIGS. 1A–1D are cross sectional side views of a portion of a SRAM device showing manufacturing stages according to an embodiment of the present invention.

In an exemplary embodiment of the present invention, reference is made to FIGS. 1A–1D where cross sectional side views of portions of a semiconductor device, for example a low power SRAM device is shown at stages in manufacture. For example in exemplary implementation of the method of the present invention, referring to FIG. 1A are shown exemplary CMOS transistors including polysilicon gates 12A and 12B. Also shown are shallow trench isolation (STI) features 14A and 14B formed in silicon wafer substrate 10 for electrical isolation of the CMOS transistors. The STI features 14A and 14B are formed by conventional methods including a photolithographic patterning and anisotropic etching process, for example reactive ion etching (RIE) followed by growth of a thermal oxide liner (not shown) to line the isolation trenches 14A and 14B. Subsequently, the trenches are backfilled with $SiO_2$ by a PECVD or HDP-CVD method followed by a CMP process to remove the excess STI oxide.

Portions of the silicon substrate 10 are thereafter exposed, and a gate oxide is thermally grown over the silicon substrate (not shown) to a thickness of about 15 to about 30 Angstroms. Subsequently, a polysilicon layer is deposited over the gate oxides including in-situ doping or followed by a doping process to form NMOS gates and PMOS gates. A photolithographic patterning and RIE etching process is then carried out to form polysilicon gates 12A and 12B. Ion implantation doping processes are then typically carried out to form doped regions, for example LDD ragions e.g., 18A and 18B adjacent the gate structures 12A and 12B, for example an SDE implant followed by a halo or pocket implant.

Sidewall spacers, e.g., 20A and 20B are next formed along the polysilicon gate structures 12A and 12B, preferably forming composite spacers to allow the formation of variable sidewall spacer widths. For example, a PECVD silicon nitride or silicon oxynitride layer are deposited followed by deposition of a PECVD silicon oxide layer followed by a photolithographic patterning and etchback process is to form sidewall spacers e.g., 20A and 20B. Optionally, a self aligned silicide (salicide) formation process is next carried out, for example, by depositing titanium or cobalt to about 100 Angstroms followed by annealing in a two step anneal process, for example in the case of $CoSi_2$, a first anneal at about 450° C. to about 500° C. followed by a second RTP anneal at about 600° C. to about 750° C. to form $CoSi_2$.

Subsequently, a wet-etching process is carried out to form low resistance contact regions above the source/drain regions, e.g., 21A and 21B and the top of the polysilicon gates e.g. 21C and 21D. Alternatively, CVD $TiSi_2$ may be selectively deposited over the source/drain regions and the top of the polysilicon gate. Raised soured/drain structures to reduce junction leakage may be optionally formed prior to salicide formation by selective epitaxial silicon growth of about 300 angstroms to about 500 Angstroms over the source/drain regions and optionally including the upper portion of the polysilicon gate structure followed by salicide formation as previously outlined.

Still referring to FIG. 1A, following salicide formation, according to an embodiment of the present invention a composite etch stop layer 24 is formed over the wafer process surface including an uppermost layer (upper portion) of silicon nitride (e.g., SixNy, $Si_3N_4$) and an underlying layer (lower portion) of silicon oxynitride (e.g., SiOxNy). The silicon oxynitride (e.g., SiON) lower portion is blanket deposited to cover the wafer process surface preferably formed in-situ by a PECVD or HDP-CVD process using silane ($SiH_4$), ammonia ($NH_3$) and one of $N_2O$ and NO, preferably $N_2O$ at a temperature of 200° C. to about 450° C. It has been found that the silicon oxynitride portion advantageously has a higher etching resistance in a subsequent RIE etching process according to the present invention allowing improved etching profile control compared to using only a silicon nitride etch stop layer. The higher etching resistance of the silicon oxynitride is believed to be due to a lower level of hydrogen incorporated into the silicon oxynitride layer. The silicon oxynitride portion (layer) is formed at a thickness of about 100 Angstroms to about 500 Angstroms depending on the difference in etching depths of a subsequent bi-level multi-step etching process.

Formed over the SiON layer is a silicon nitride (e.g., SiN) layer preferably formed by a PECVD or HDP-CVD process using silane ($SiH_4$) and at least one of nitrogen and ammonia at a temperature of 200° C. to about 400° C. Less preferably due to increased process costs and reduce wafer throughput, the silicon nitride portion may be formed by an LPCVD process, for example using dichlorosilane ($SiCl_2H_2$) and ammonia ($NH_3$) at between 650° C. and 750° C., more preferably, silane ($SiH_4$) and ammonia ($NH_3$) between 700° C. and 900° C. The silicon nitride portion is formed at a thickness of about 200 Angstroms to about 800 Angstroms.

Still referring to FIG. 1A, following formation of the composite etch stop layer 24 according to preferred embodiments, an ILD layer comprising a first dielectric insulating layer 26A, preferably boro-phosphosilicate glass (BPSG) or BPTEOS. BPSG is preferably formed insitu by a PECVD or HDP-CVD reaction using, silane ($SiH_4$), $O_2$, $PH_3$, and $B_2H_6$; more preferably, BPTEOS is formed, preferably using TEOS (Si $(OC_2H_5)_4$) and $O_2$ or an $O_2/O_3$ mixture with trimethyl borate (TMB) and trimethyl phosphate (TMP) with an O2: TEOS ratio of about 10:1 to about 20:1 at about 300° C. to about 500° C. Preferably the BPSG or BPTEOS (oxide) layer 26A is formed having a wt% of boron and phosphorus from about 3 wt% to about 5 wt%. Preferably, the BPSG or BPTEOS layer is blanket deposited over the composite etch stop layer at a thickness of about 3000 Angstroms to about 6000 Angstroms followed by an optional annealing step at about 700° C. to about 800° C. to densify the oxide layer. Preferably a wafer cleaning process using $H_2SO_4$ and $H_2O_2$ is carried out following the densification process.

Still referring to FIG. 1A, following formation of the BPSG or EPTEOS layer 26A, a second dielectric insulating layer (oxide layer) 26B is deposited over the first dielectric insulating layer 26A to complete formation the XLV layer, preferably a PETEOS layer according to a PECVD or HDP-CVD process using TEOS (Si $(OC_2H_5)_4$) and $O_2$ or an $O_2/O_3$ mixture with an $O_2$: TEOS ratio of about 10:1 to about 20:1. Preferably, the PETEOS layer 26B is blanket deposited over the first dielectric insulating layer 26A at a thickness of about 5000 Angstroms to about 10000 Angstroms. Following formation of the PETEOS layer, a CMP process is carried out to planarize the PETEOS layer followed by formation of an overlying PECVD SiON bottom anti-reflectance coating BARC layer 27A, formed at a thickness of about 400 Angstroms to about 800 Angstroms, more preferably about 600 Angstroms followed by forming a capping oxide ($SiO_2$) layer 27B by a PECVD or HDP-CVD process at a thickness of about 100 Angstroms to about 400 Angstroms.

Still referring to FIG. 1A, following formation of the BPSG or BPTEOS layer 26A, a second dielectric insulating layer (oxide layer) 26B is deposited over the first dielectric insulating layer 26A to complete formation the ILD layer, preferably a PETEOS layer according to a PECVD or HDP-CVD process using TEOS ($Si(OC_2H_5)_4$) and $O_2$ or an $O_2/O_3$ mixture with an $O_2$: TEOS ratio of about 10:1 to about 20:1. Preferably, the PETEOS layer 26B is blanket deposited over the first dielectric insulating layer 26A at a thickness of about 5000 Angstroms to about 10000 Angstroms. Following formation of the PETEOS layer, a CMP process is carried out to planarize the PETEOS layer followed by formation of an overlying PECVD SiON bottom anti-reflectance coating BARC layer 27A, formed at a thickness of about 400 Angstroms to about 800 Angstroms, more preferably about 600 Angstroms followed by forming a capping oxide ($SiO_2$) layer by a PECVD or HDP-CVD process at a thickness of about 100 Angstroms to about 400 Angstroms.

Still referring to FIG. 1A, a photolithographic patterning process is carried out by patterning an overlying photoresist layer 28 to carryout a multi-step plasma enhanced etching process, for example reactive ion etching (RIE), to etch contact holes in a multi-step bi-level etching process. In a first RIE etching process, a high density plasma, preferably formed by a transformer coupled plasma (TCP) source or inductively coupled plasma (ICP) source, also referred to as a dual source plasma (DSP), is used for the RIE etching process since an anisotropicity and etching speed are improved.

Still referring to FIG. 1A in a first step in the first RIE etching process, at least a thickness of the oxide capping layer 27B and SiON BARC layer are etched through according to the patterned photoresist layer 28 to form contact openings e.g., 30A and 30B. Preferably, the plasma is operated between a pressure of about 0 to about 100 milli-Torr at a power of about 0 to about 4000 Watts using a plasma chemistry including source gas flow rates of $C_2F_6$ at about 0 to about 200 sccm, $O_2$ at about 0 to about 200 sccm and Ar at about 0 to about 1000 sccm.

Figure 1B:
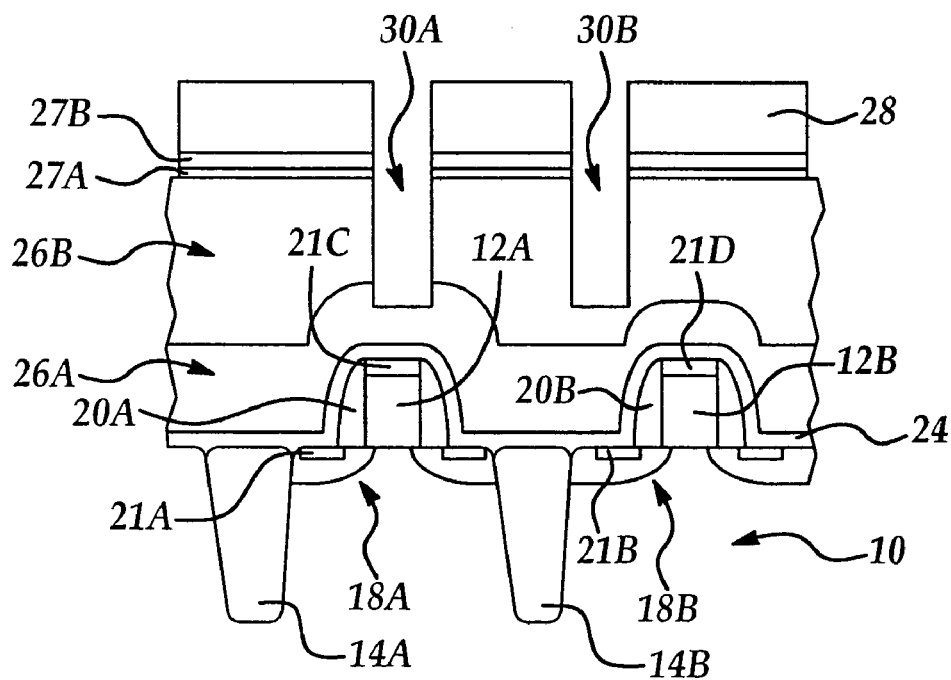

Referring to FIG. 1B, in a second step of the first RIE etching process, the contact openings e.g., 30A and 30B are etched through about one-half the total thickness of the PETEOS layer and the BPSG or BPTEOS layer, preferably to stop above a first contact hole etching depth level, e.g., polysilicon gate 12A. Alternatively, the second step may expose the composite etching stop layer 24 at the first contact hole etching depth level e.g., over polysilicon gate 12A. In the second RIE etching step, preferably RIE plasma operating parameters include a pressure of about 0 to about 100 milliTorr at a power of about 0 to about 4000 Watts using a plasma chemistry including source gas flow rates of $C_4F_8$ at about 0 to about 200 sccm, $C_2F_6$ at about 0 to about 200 sccm, and CO at about 0 to about 1000 sccm.

Figure 1C:
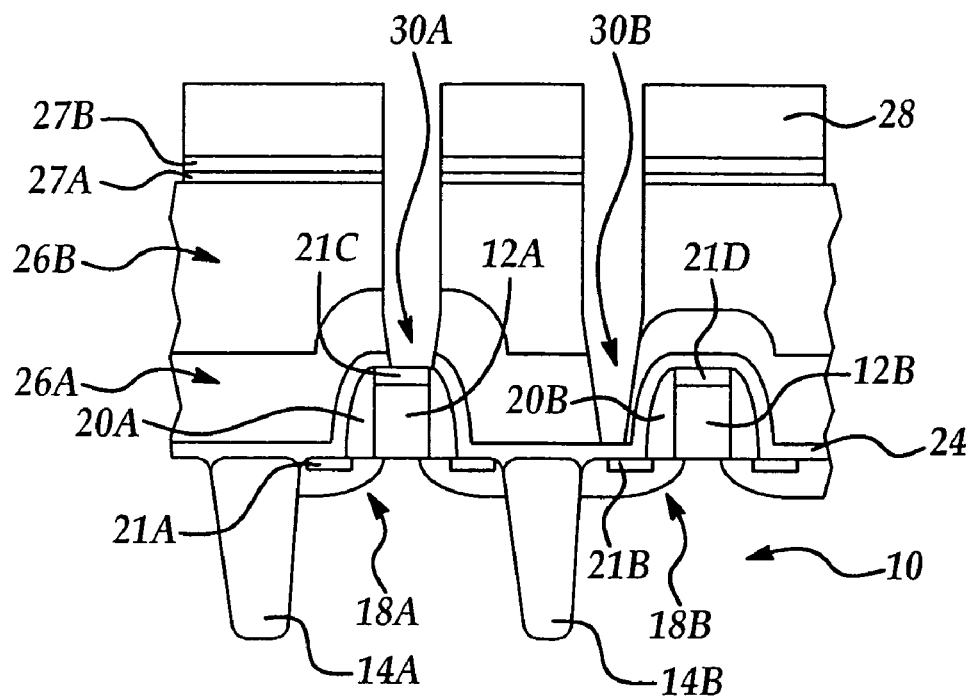

Referring to FIG. 1C, In a third RIE etching step, also referred to as an overetch process, anisotropic etching is carried out to etch through a remaining portion of the dielectric insulating layers above the contact areas, e.g., top portion of polysilicon gate 21C and drain/source region 21B to expose the composite etch stop layer 24 over areas 21C and 21B. In the third etching step, preferably RIE plasma operating parameters include a pressure of about 0 to about 100 milliTorr at a power of about 0 to about 4000 Watts using a plasma chemistry including source gas flow rates of $C_4F_8$ at about 0 to about 200 sccm, $C_2F_6$ at about 0 to about 200 sccm, and CO at about 0 to about 200 sccm and argon at about 1 to about 1000 sccm.

Preferably, during the third etching step a contact opening diameter, having a average diameter from the first and second etching process of about 0.19 to about 0.21 microns is formed with a sloping (tapered) etching profile narrowing from an average opening diameter of about 0.19 to about 0.21 microns to about 0.12 to about 0.14 microns, more preferably 0.13 microns, at the bottom of the contact opening to at least partially expose the composite etching stop layer 24. For example, preferably, the angle of sloping profile is from about 83 degrees to about 87 degrees with respect to horizontal to achieve about a 0.13 micron diameter opening at the bottom of at least the relatively deeper contact opening e.g., 30B extending to the source/drain regions e.g., 21A. The sloping profile at the bottom portion of the deeper contact opening e.g., 30B is an important feature of this invention, allowing the selective anisotropic etching of the ILD oxide while avoiding excessive etching of the composite etch stop layer 24.

In addition, the capping oxide layer 27B together with the BARC layer 27A at the upper portion of the contact openings e.g., both 30A and 30B are more effective compared to prior art processes of preventing sidewall etching widening the contact hole diameter at an upper portion of the contact openings. Further, using a relatively wider upper portion of the contact opening allows narrower linewidths at a bottom portion to be achieved without premature etch stop. The plasma etch recipe used according to an embodiment of the present invention during the third etching process allows an increased rate of fluoropolymer deposition on the sidewalls of the contact opening thus improving a selectivity for oxide etching at a bottom portion of the contact opening, e.g., 30B and preventing excessive sidewall etching in the more shallow (lesser depth) contact opening e.g., 30A.

In addition, the inclusion of a silicon oxynitride lower portion of the composite etch stop layer 24 and in the BARC layer 27A together with the preferred etch recipe allows formation of a sloping etch profile in a lower part of a relatively deeper contact opening e.g., 30B, for example, extending to source and/or drain regions, resulting in better landed contact holes thereby improving electrical device operating parameters, for example a standby current (Isb) and a drive current (Idr) for operating an ultra low power SRAM device.

According to the present invention of forming a composite etch stop layer 24, having an lower portion of silicon oxynitride, an etching rate through the etch stop layer 24 underlying the shallow contact holes e.g., 30A is slowed in the third etching step, allowing non-landed contact holes e.g., 30B to be etched deeper without prematurely exposing and damaging the top of the polysilicon gate e.g., 21C under contact opening 30A.

Figure 1D:
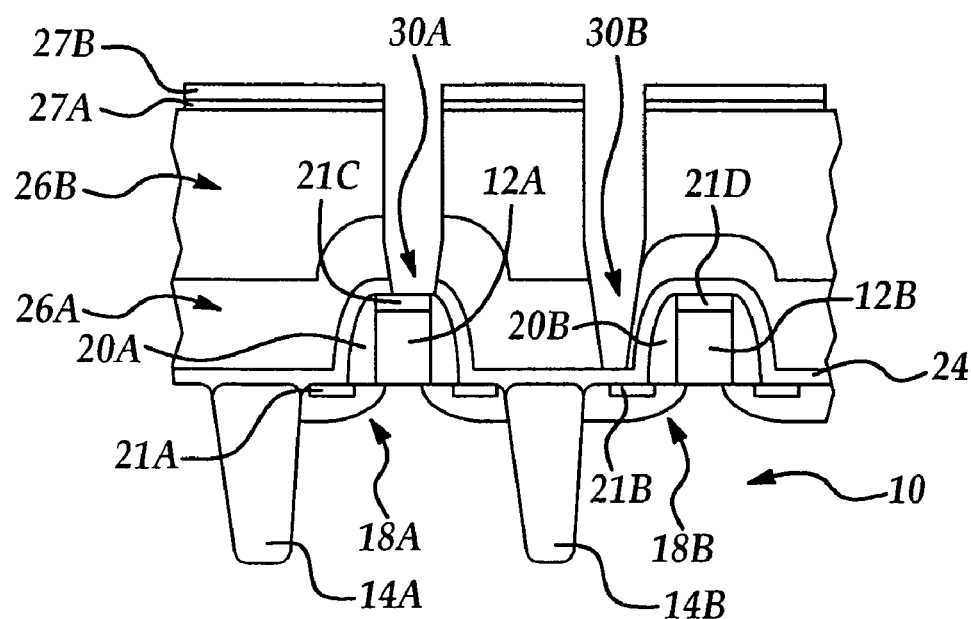

Referring to FIG. 1D in another embodiment of the present invention, following the third etching step, a second RIE etching process is carried out to etch through the composite etch stop layer 24. The second RIE etching process is preferably a two step process including a first step of clearing away polymer etching residue at the bottom of the contact openings followed by a second step of etching through a thickness of the composite etch stop layer 24 and through at least a thickness portion of the silicide layers over the top portion of the polysilicon gate e.g., 21C and over the drain/source regions e.g., 21B. The second RIE etching process is preferably carried out following removal of the photoresist layer and may be carried out in the same TCP or ICP RIE etcher previously used, but is preferably carried out in a plasma reactor where the self bias Voltage is maintained at less than about 100 Volts to reduce a plasma induced etching damage. For example, preferably, a magnetic-enhanced reactive ion etcher (MERIE) is used to reduce a plasma induced damage which frequently occurs when etching near silicon and polysilicon portions of a device. The electron bombardment in an MERIE is significantly reduced in these reactors due to a helical electron path where the electrode self bias is easily maintained at less than about 100 Volts. As a result, plasma induced damage related to induced Fowler-Nordheim tunneling current through gate oxides is reduced.

Following formation of the contact openings conventional metal filling processes, for example tungsten, aluminum/ copper or copper metal filling processes are carried to complete the formation of the contacts. Conventional subsequent processes are carried out to complete the formation of an integrated circuit, for example an SRAM device.

Figure 2:
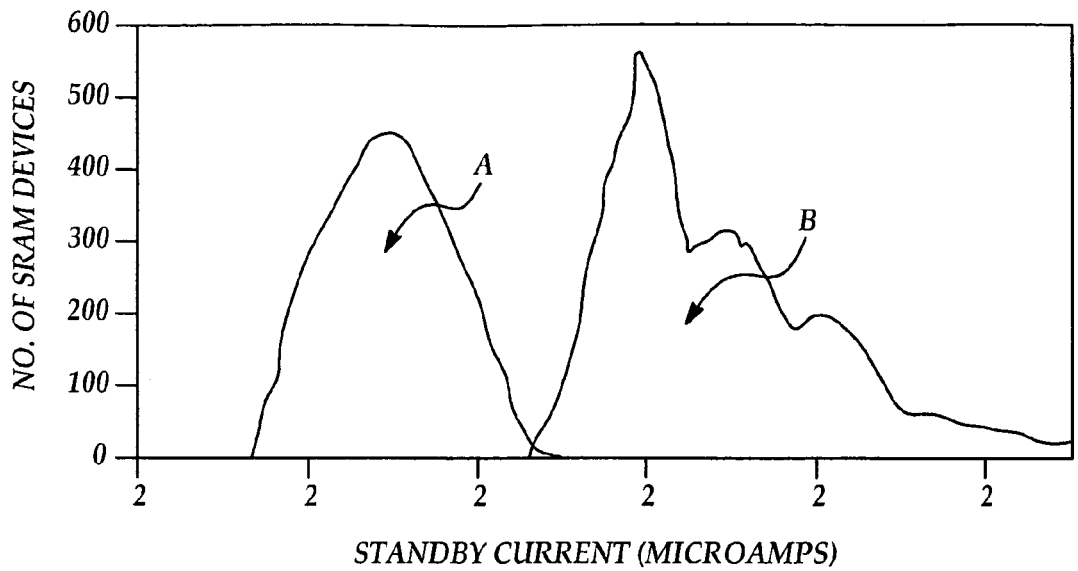
FIG. 2 shows SRAM device standby current measurement distribution data of devices formed according to embodiments of the present invention contrasted with devices formed according to prior art processes.

Referring to FIG. 2 are shown distributions of standby current measurements made on ultra low power SRAM devices. Shown in area A is a distribution area including a distribution of device measurements and resulting standby operating currents for devices formed according to preferred embodiments including a composite etch stop layer, a BARC layer, and the multi-step etching recipe resulting in standby currents of about 3 to about 4 microamps shown on the horizontal axis. In contrast, in area B the distribution of device measurements and resulting standby operating current for devices formed according to prior art processes results in standby currents of about 4.5 to about 7 microamps.

Forming SRAM devices according to preferred embodiments of the present invention with electrical design specifications of a standby current to drive current ratio (Isb/Idr) of 9 microamps to 5 microamps results in yields of about 90 percent at test conditions of about 85° C. compared to yields of about 30% using prior art processes. An added benefit of forming semiconductor devices according to embodiments of the present invention is that the silicon oxynitride BARC and cap oxide layer acts to reduce the particulate contamination of the etch chamber and resulting wafer particulate contamination.

Figure 3:
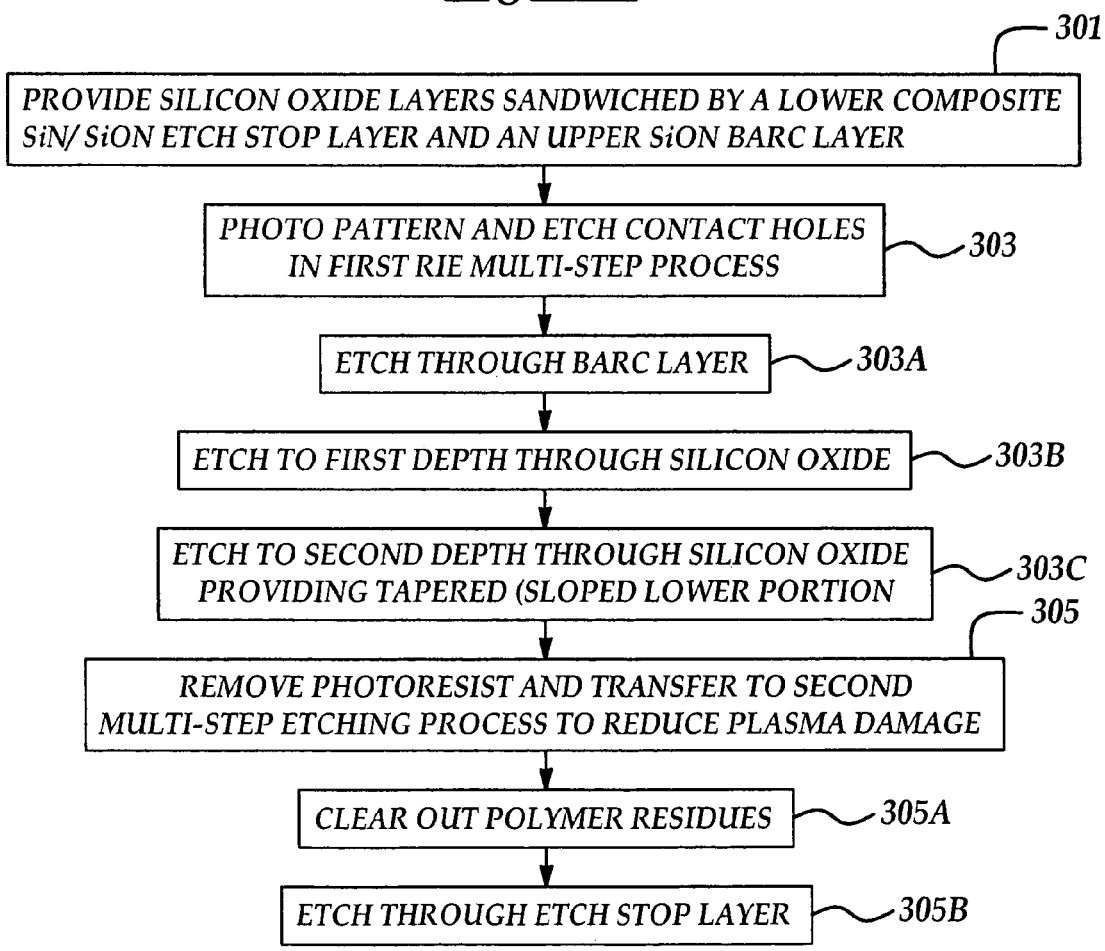
FIG. 3 is a process flow diagram including several embodiments of the present invention.

In FIG. 3 is shown a process flow diagram including several embodiments of the present invention. In process 301, CMOS transistors are provided with at least one overlying silicon oxide ILD layer sandwiched between a lower SiON/SiN composite etch stop layer and an upper SiON BARC layer with a capping oxide layer. In process 303, a multi-step etching process is carried out following a photolithographic patterning process to form contact holes. In process 303A, a first etching step in a first etching process etches through the capping oxide and BARC layer thickness. In process 303B, a second etching step etches through the silicon oxide ILD layers to form a first set of contact openings exposing the composite etch stop layer over a first contact area. In process 303C, a third etching step is carried out to deepen a portion of the first set of contact openings to form a second set of contact openings exposing the composite etch stop layer over a second set of contact openings disposed at a greater depth compared to the first set of contact openings the second set of contact openings including a sloped sidewall extending to over bottom portions of the first and second contact openings. In process 305, the photoresist layer is removed and the process wafer is subjected to a second etching process where the self bias is maintained at less than 100 Volts. In process 305A, a first etching step in the second etching process cleans out polymer residues at a bottom portion of the contact openings. In process 305B, the etch stop layer thickness is then etched through including a thickness portion of an underlying silicide layer to complete formation of the contact openings. Conventional subsequent processes are carried out to complete the formation of the integrated circuit.

Thus, a method has been presented for reliably forming contact openings in a multi-depth etching process to improve etching profiles by increasing an oxide etching selectivity while preventing premature etching of the etch stop layer and widening of the contact opening. The method is particularly advantageous for achieving electrical design specifications in a low power SRAM device. In addition, gate oxide integrity is preserved by avoiding plasma induced etching damage.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming contact openings in a semiconductor device comprising the steps of:

providing a semiconducting substrate;

forming an etch stop layer on said semiconducting substrate, said etch stop layer formed of a first material comprising a lowermost portion and a second material comprising an uppermost portion;

forming a dielectric layer on said etch stop layer;

forming a bottom anti-reflective coating (BARC) on said dielectric layer;

forming and patterning a mask on said BARC layer; and, forming at least a first contact opening extending through said dielectric layer comprising a narrowingly tapered bottom portion in said dielectric layer including exposing said etch stop layer by at least a first etching process.

2. The method of claim 1, further comprising the step of removing said etch stop layer exposed in said first contact opening by a subsequent etching process.

3. The method of claim 1, wherein said first contact opening comprises an untapered upper portion.

4. The method of claim 1, wherein the etch stop layer lowermost portion comprises silicon oxynitride and the uppermost portion comprises silicon nitride.

5. The method of claim 4, wherein the lowermost silicon oxynitride portion is formed having a thickness of about 100 Angstroms to about 500 Angstroms and the uppermost silicon nitride layer portion is formed having a thickness of about 200 Angstroms to about 1000 Angstroms.

6. The method of claim 1, wherein the BARC layer comprises a silicon oxyriitride layer and an overlying capping silicon oxide layer.

7. The method of claim 6, wherein the BARC layer is formed having a thickness of about 400 Angstroms to about 700 Angstroms and the capping silicon oxide layer is formed having a thickness of about 100 to about 400 Angstroms.

8. The method of claim 1, wherein the at least a first etching process comprises forming a second contact opening, wherein the second contact opening is etched to a greater depth than the first contact opening, said second contact opening comprising an untapered upper portion and a narrowingly tapered bottom portion.

9. The method of claim 8, wherein the first contact opening extends to a top portion of a polysilicon gate and the second contact opening extends to one of a source and drain region.

10. The method of claim 1, wherein the etch stop layer is removed by a subsequent etching process wherein a self-bias voltage is maintained below about 100 Volts.

11. The method of claim 10, wherein the subsequent etching process comprises a reactive ion etch (RIE) etcher selected from the group consisting of an inductively coupled power (ICP), Transformer coupled power (TCF) magnetic-enhanced reactive ion etcher (MERIE).

12. The method of claim 1, wherein the semiconductor substrate further comprises CMOS transistors formed underlying the etching stop layer.

13. A method of forming contact openings in a semiconductor device in a bi-level etching process comprising the steps of:

provinding a semiconducting substrate comprising CMOS transistors formed on the substrate;

forming an etch stop layer comprising a first material forming a lowermost portion and a second material forming an uppermost portion on the semiconducting substrate including the CMOS transistors;

forming at least one dielectric layer on the etch stop layer;

forming a bottom anti-reflective coating (BARC) layer on the at least one dielectric layer;

forming and patterning an etching mask on said BARC layer; and, forming first and second contact openings exposing said etch stop layer, said second contact opening having a depth greater than the than the first contact opening and wherein said second contact opening comprises an untapered upper portion and a narrowingly tapered bottom portion comprising said at least one dielectric layer, said taper narrowing toward a bottom of said second contact opening.

14. The method of claim 13, further comprises removing the etch stop layer in a separate etching process.

15. The method of claim 13, wherein forming the first and second contact openings comprises a multi-step dry etching process.

16. The method of claim 13, wherein the first contact opening comprises an untapered upper portion and a narrowingly tapered bottom portion, said taper narrowing toward a bottom of said first contact opening.

17. The method of claim 13, wherein the etch stop layer lowermost portion comprises silicon oxynitride and the uppermost portion comprises silicon nitride.

18. The method of claim 13 wherein the BARC layer comprises a lower silicon oxynitride layer and an upper capping silicon oxide layer.

19. The method of claim 13, wherein the first contact opening extends to a top portion of a polysilicon gate and the second contact opening extends to one of a source and drain region.

20. The method of claim 14, wherein the separate etching process is carried out wherein a selfbias voltage is maintained below about 100 Volts.

21. The method of claim 20, wherein the second etching process comprises a reactive ion etch (RIE) etcher selected from the group consisting of an inductively coupled power (ICP), transformer coupled power (TCP), and magnetic-enhanced reactive ion etcher (MERIE).

22. The method of claim 20, wherein the second etching process is carried out using a magnetic-enhanced reactive ion etcher (MERIE)

23. A method of forming contact openings to form CMOS device contacts in a multi-step dry etching process comprising the steps of:

providing a semiconducting substrate;

forming a composite etch stop layer comprising a first material comprising a lowermost portion and a second material comprising an uppermost portion;

forming a dielectric layer on said etch stop layer;

forming a first and second contact opening to a first depth of said dielectric layer comprising an untapered portion by a first etching process; and, extending said second contact opening by a second etching process to a second depth of said dielectric layer greater than said first depth to expose said etch stop layer wherein said second contact opening comprises a narrowingly tapered bottom portion comprising said dielectric layer, said taper narrowing toward a bottom of said second contact opening.

24. The method of claim 23 wherein said etch stop layer is removed in a subsequent etching process comprising a self-bias voltage maintained at less than about 100 volts.

25. The method of claim 23 wherein said first material comprises silicon oxynitride and said second material comprises silicon nitride.

26. The method of claim 23 wherein the first contact openings comprises a narrowingly tapered bottom portion, said taper narrowing toward a bottom of said contact first opening.

27. The method of claim 23, further comprising a silicon oxynitride BARC layer on the dielectric layer and a silicon oxide capping layer on the BARC layer.

* * * * *